United States Patent [19]

Kasperkovitz

[11] Patent Number: 4,633,315
[45] Date of Patent: Dec. 30, 1986

[54] RECEIVER FOR RF-SIGNALS COMPRISING A PAIR OF PARALLEL SIGNAL PATHS

[75] Inventor: Wolfdietrich G. Kasperkovitz, Eindhoven, Netherlands

[73] Assignee: U.S. Philips Corporation, New York, N.Y.

[21] Appl. No.: 592,646

[22] Filed: Mar. 23, 1984

[30] Foreign Application Priority Data

Apr. 1, 1983 [NL] Netherlands ..................... 8301179

[51] Int. Cl.[4] .................. H04N 5/14; H04N 5/44
[52] U.S. Cl. ....................... 358/188; 358/160; 358/174; 358/23; 455/265
[58] Field of Search ................. 358/188, 160, 195.1, 358/198, 21 R, 23, 174, 148; 455/260, 265; 329/50, 122, 124

[56] References Cited

U.S. PATENT DOCUMENTS

| 4,157,569 | 6/1979 | Apeldoorn et al. | 358/188 X |
|---|---|---|---|
| 4,159,482 | 6/1979 | Apeldoorn | 358/23 |
| 4,314,206 | 2/1982 | Attwood et al. | 329/50 |
| 4,359,692 | 11/1982 | Ryan | 329/50 |
| 4,509,205 | 4/1985 | Kasperkovitz | 455/265 X |

Primary Examiner—James J. Groody
Assistant Examiner—E. Anne Toth
Attorney, Agent, or Firm—Thomas A. Briody; Jack Oisher; William J. Streeter

[57] ABSTRACT

A receiver for receiving a signal modulated on an RF-carrier, includes amplitude and phase control for reducing, to a very low value, deviations in the amplitude and phase correspondence of the signals in two signal paths therein in order to avoid an image interference signal due to incomplete mutual cancellation or image frequency rejection of unwanted modulation signals.

33 Claims, 17 Drawing Figures

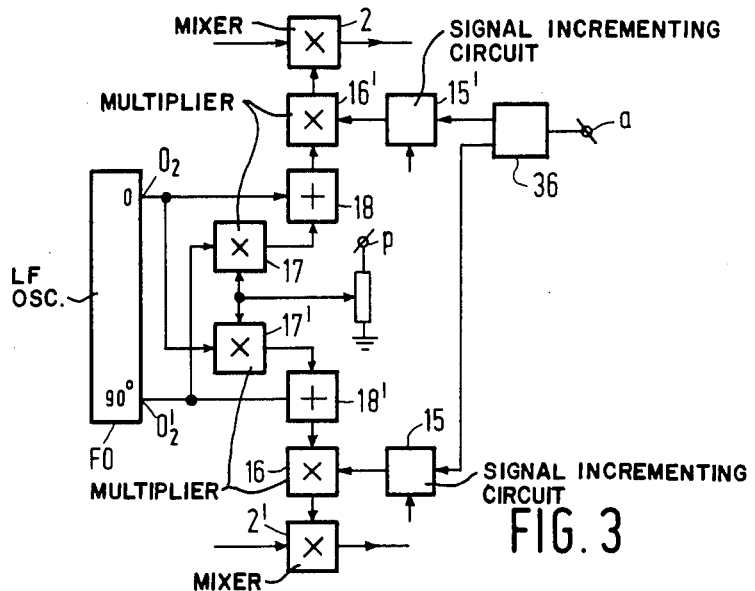
FIG. 3
FIG.4B  FIG.4A
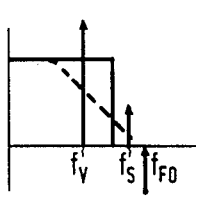 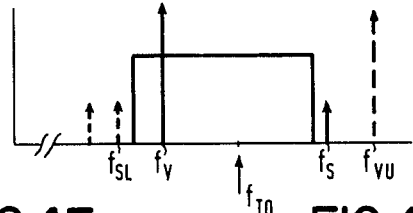
FIG.4C  FIG.4E  FIG.4F
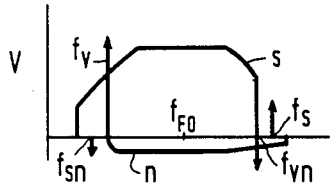 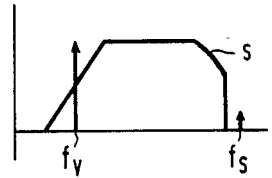 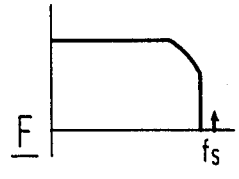
FIG.4D  FIG.4G
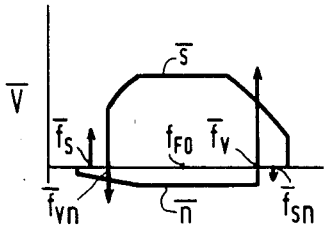 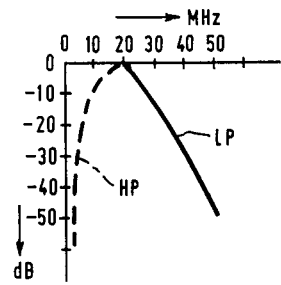
FIG.4H FIG.5A
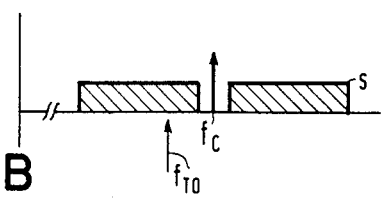
FIG.5B
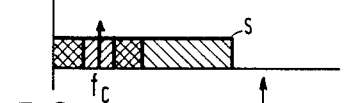
FIG.5C
FIG.5D
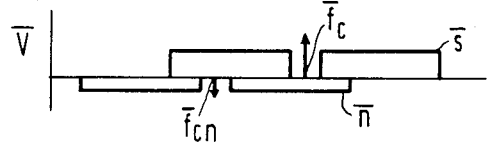
FIG.5E
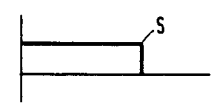
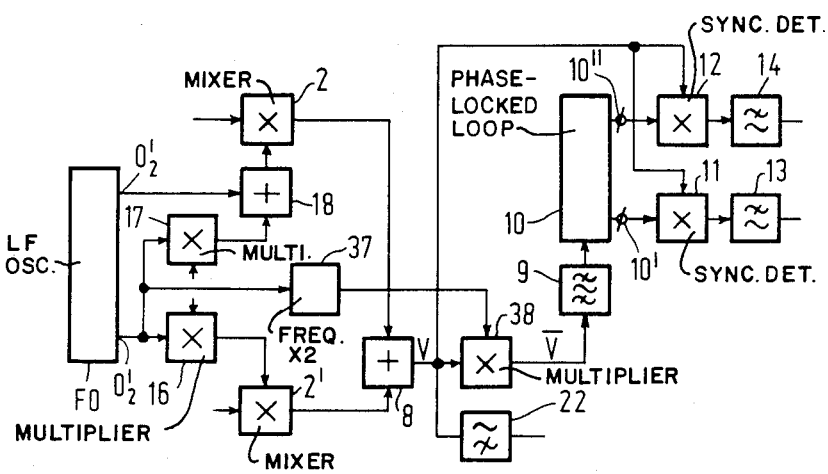
FIG.6

RECEIVER FOR RF-SIGNALS COMPRISING A PAIR OF PARALLEL SIGNAL PATHS

BACKGROUND OF THE INVENTION

The invention relates to a receiver for receiving a signal modulated on an RF-carrier the receiver, comprising a pair of signal paths arranged in parallel between an RF input and a superposition circuit and including, arranged in succession, a pair of first mixing stages for mixing down the frequency of the received modulated RF-carrier to a low frequency, mixing signals being applied in a phase quadrature relationship to these first mixing stages from an RF-tuning oscillator, a pair of filtering elements for signal selection and a pair of second mixing stages for up-converting the frequency of the selected modulated carrier, mixing signals being applied also in a phase quadrature relationship to these second mixing stages from a fixed LF-oscillator, these second mixing stages being connected to inputs of the superposition circuit, the superposition circuit comprising an adding or a subtracting stage arranged between outputs of the two signal paths and producing a first output signal.

The principle of such a receiver is known from the article "A third method of generation and detection of SSB signals", by D. K. Weaver, published in "Proceedings of the IRE", 1956, Vol. 44, No. 12, pages 1703–1705, and is not limited to the reception of single-side-band signals. The use of this principle for the reception and processing of double-sideband signals is known, from, for example, German Patent Application No. 26 57 170, which has been laid open to public inspection.

Signal processing in receivers of this type generally amounts to the following: a desired modulation signal modulated on an RF-carrier and applied to the two first mixing stages is down-converted to a low frequency range with the aid of a tunable oscillator frequency at or near the center frequency in the spectrum of this RF-signal. In the case of a single-sideband-modulated RF-signal, this results in the base frequency band of the modulation signal being folded around 0 Hz and in the case of a double-sideband-modulated RF-signal, the center frequency corresponding to the carrier frequency and the oscillator frequency being adjusted to this carrier frequency, this results in a frequency conversion of the modulation signal to the base frequency band. In addition, as a result of the mutual phase quadrature relationship between the mixing signals applied to the two first mixing stages, a 90°-phase difference is produced between the low-frequency (LF) modulation signals at the outputs of these mixing stages.

After signal selection in the two filtering elements, which may be of a simple structure and of a comparatively narrow-band nature, the LF phase-quadrature modulation signals are mixed in the two second mixing stages with the phase quadrature mixing signals of the fixed LF-oscillator. This mixing operation results in two sub-signals whose frequency spectra are mutually mirror-inverted relative to the frequency of the fixed LF-oscillator, and the sum of which is available at the output of one second mixing stage and the difference at the output of the other second mixing stage. As this sum and this difference also form the sum and the difference, respectively, of two equal modulation signals which are mutually mirror-inverted around the last-mentioned LF-oscillator frequency, a suitable superpositioning (that is to say mutually adding and subtracting) of this sum and this difference in the superposition circuit has for its result that the modulation signal with the desired frequency spectrum becomes available, modulated on a center frequency which depends on the fixed LF-oscillator frequency, or in a special case as described, for example, in the above-mentioned article by D. K. Weaver, in the baseband. The unwanted modulation signals in the sum and the difference, respectively, which have a frequency spectrum which is mirror-inverted relative to the desired modulation signals, then cancel each other. The desired, or so-called first, output signal at the output of the superposition circuit is thereafter converted to base-band in a processing circuit and reproduced by means of a reproducing device.

However, in practice, deviations occur in the amplitude and phase correspondence of the signals in the two signal paths, which may cause amplitude and phase deviations in the frequency spectrum of the desired modulation signal at the output of the superposition circuit, and also an image interference signal due to an incomplete mutual cancellation or image frequency rejection of the unwanted modulation signals. More specifically, in wide-band applications, such as, for example in T.V-receivers, these deviations result in impermissible interference effects.

SUMMARY OF THE INVENTION

The invention has for its object to provide a receiver of the type described in the opening paragraph, in which deviations in the amplitude and phase correspondence of the signals in the two signal paths can be reduced, by means of an amplitude and phase control, to a very low value, at least so low as to be disregarded, in order to avoid the interference effects, and which control is integrable for at least a major part.

According to the invention, such a receiver is characterized by means connected to the two signal paths for producing a second output signal which, relative to the first output signal, is mirror-inverted around the frequency of the fixed oscillator, and one of said output signals being applied to a carrier selection circuit which is connected, on the one hand, to a carrier input of a first synchronous demodulator and, on the other hand, to a carrier input of a second synchronous demodulator via a 90° phase-shifter, and which the other output signal is applied to signal inputs of the two synchronous demodulators, these two synchronous demodulators being connected to an amplitude control input and to a phase control input, respectively, of a controllable balancing arrangement via low-path filters, this controllable balancing arrangement comprising an amplitude and a phase control circuit for mutually balancing the amplitudes and phases of the signals in the two signal paths.

The invention makes advantageous use of the fact that the extent of amplitude and phase unbalance between the two signal paths mutually is directly expressed in the amplitude and phase of the image interference components in each of both said output signals and that the frequency location of these image interference components is accurately defined.

The invention is based on the recognition that the amplitude and phase of the image interference component of one signal component in the first or second output signal, provided it is chosen correctly, is a reliable measure of the amplitude and phase of the total image interference signal in each of the two output signals and, consequently, also of the amplitude and phase unbalance between the two signal paths, and that for that purpose, a carrier, which may, for example, be a pilot signal or the intermediate-frequency carrier of the modulation signal itself, is particularly suitable.

The invention is based on the further recognition of the fact that by a synchronous detection of the in-phase component, hereinafter also called synchronous in-phase detection of this image interference component, an indication is obtained about the amplitude unbalance, and by a synchronous detection of the quadrature component, hereinafter also called synchronous quadrature detection, an indication about the phase unbalance between the two signal paths.

When the measure according to the invention is used, the image interference signal in the first output signal has the same frequency position as the modulation signal in the second output signal and vice versa. By selecting a carrier from one of the two output signals, preferably the carrier on which the relevant modulation signal has been modulated, and by using it as a detection carrier for the synchronous in-phase detection in the first synchronous demodulator, and, after a 90°-phase shift, as a detection carrier for the synchronous quadrature detection in the second synchronous demodulator of the image interference signal in the other output signal, d.c. voltages, which vary with the amplitude and the phase unbalance between the two signal paths, are obtained at the outputs of the two synchronous demodulators. By using these d.c. voltages as control voltages for a mutual amplitude and phase control of the signals in the two signal paths, the object of the invention can be accomplished in a simple way.

A preferred embodiment of a receiver according to the invention, is characterized in that said means comprise a further superposition circuit, one of said two superposition circuits comprising an adding stage and the other superposition circuit comprising a subtracting stage, this adding stage producing said one output signal and this subtracting stage producing said other output signal.

When this measure is used, each of both output signals which are mutually mirror-inverted around the fixed oscillator frequency become available separately at the output of the adding stage and the subtrating stage, respectively, by a mutual addition and subtraction, respectively, of the output signals of the two second mixing stages, these lastmentioned output signals, as described in the foregoing, forming the sum and the difference, respectively, of two modulation signals which are mutually mirror-inverted around the fixed oscillator frequency.

In another preferred embodiment of a receiver according to the invention, said second output signal is produced by mirror-inverting said first output signal relative to the fixed oscillator frequency. To this end, this preferred embodiment is characterized in that said means comprise a multiplying circuit, a first input of which is connected to the signal paths via the superposition circuit and a second input to an output of the fixed LF-oscillator, to which second input, an oscillator frequency is applied which is twice the oscillator frequency applied to the two second mixing stages.

When this measure is used, said mirror inversion is realized by multiplying the first output signal by twice the oscillator frequency applied to the two second mixing stages, i.e twice the fixed oscillator frequency. The lower sideband product of this multiplication then forms said second output signal.

A preferred embodiment of a receiver according to the invention, suitable for receiving television signals, is characterized in that the frequency of the RF-tuning oscillator when being correctly tuned to a broadcast transmission, is located between the picture and the sound carriers of the desired television signal, that the frequency of the mixing signals applied from the fixed LF-oscillator to the second mixing stages is at least equal to the highest signal frequency in the signal at the output of the two filtering elements and is of the order of magnitude thereof, and that the carrier selection circuit is adjusted to one of said carriers in the first or second output signal applied to the carrier selection circuit.

When this measure is used, both the picture and the sound carrier in the received television signal is suitable for use as a reference of the image interference signal whose amplitude and phase are to be measured, and a perfect unfolding of the low-frequency TV-modulation signals is effected at a frequecy of the fixed LF-oscillator which is sufficiently low to realize a carrier selection with a simple carrier selection circuit.

A further preferred embodiment of such a receiver for television signals is characterized in that the carrier selection circuit is adjusted to the picture carrier in the first or second output signal applied to the carrier selection circuit, this carrier selection circuit being connected, for an automatic gain control, via a gate circuit and a peak detector, to a variable amplifier device connected to the two signal paths, this gate circuit being controlled by means of a gate signal derived from the line synchronizing signal of the received TV-signal.

When this measure is applied, the picture carrier is used as a reference for both the image interference signal and the amplitude of the received TV-signal for an automatic gain control.

A still further preferred embodiment is characterized in that the carrier selection circuit is adjusted to the picture carrier in the first or second output signals applied to the carrier selection circuit, which output signal is also applied, via a high-pass filter, to a synchronous video detector included in the processing arrangement, this carrier selection circuit also being connected to a carrier input of the synchronous video detector.

When this measure is applied, the picture carrier selected in the carrier selection circuit is not only used as a reference for the image interference signal, but also as a carrier for a synchronous detection of the video signal and intercarrier detection of the sound signal.

A further preferred embodiment of a receiver for receiving television signals having a frequency-modulated sound carrier according to the invention, is characterized in that the carrier selection circuit is adjusted to the center frequency of the frequency-modulated sound carrier in the first or second output signal applied to the carrier selection circuit, which output signal is also applied to a first input of a multiplying circuit, that an output of the carrier selection circuit is connected to a second input of the multiplying circuit and an output of the multiplying circuit is connected, via an integrator for an automatic gain control, to a variable amplifier connected to both signal paths.

When this measure is applied, the sound carrier is used as a reference for both the image interference signal and the amplitude of the received TV-signal for an automatic gain control.

A further preferred embodiment of such a receiver is characterized in that the carrier selection circuit is adjusted to the center frequency of the sound carrier in the first or second output signal applied to the carrier selection circuit, and is connected to the two synchronous demodulators via a phase-locked loop, which phase-locked loop comprises a phase detector connected to the carrier selection input, a loop filter and a voltage-controlled oscillator having an in-phase and a quadrature output, which in-phase output is connected to the carrier input of the first synchronous demodulator, and which quadrature ouput is connected to the phase detector and also to the carrier input of the second synchronous demodulator, an output of the loop filter being connected to an audio signal processing unit and one of said output signals being applied, via a high-pass filter, to a signal input of a synchronous video detector and to a picture carrier regenerator, this picture carrier regenerator being connected to a carrier input of the synchronous video detector.

When this measure is applied, a regeneration of the sound carrier for a determinaton of the image interference signal is obtained with the aid of said phase-locked loop, which simultaneously realizes a sound detection which is independent of the video signal detection.

In another preferred embodiment of a receiver according to the invention, in which a carrier regeneration is realized by means of a phase-locked loop for a determination of the image interference signal, the control signal of the voltage-controlled oscillator at the output of the loop filter of this phase-locked loop is applied, as a control signal via an integrator, to the RF-tuning oscillator for an automatic frequency control.

In a receiver for television signals according to the invention, for an adequate adjacent-channel selectivity, the two filtering elements are $6^{th}$-order low-pass filters having a 3 dB cross-over frequency of at least substantially 2.25 MHz, and the first or the second output signal is applied to a high-pass filter which is preferably of the $2^{nd}$ order and has a 3 dB cross-over frequency of at least substantially 1.5 MHz.

Another preferred embodiment of a receiver according to the invention is characterized in that the phase control circuit comprises a first adding circuit arranged between the outputs of one of the two oscillators and one of the two mixing stages to which mixing signals are applied by this oscillator, and also arranged between one of said outputs and the adding circuit, a first level controller, a control input of which is connected to the phase control input of the balancing device.

When this measure is applied, a simple realization of the phase control circuit is possible.

A further preferred embodiment of such a receiver is characterized in that the phase control circuit is of a balanced structure and comprises a second adding circuit, these two adding circuits each being connected, via a first input and an output, between the respective outputs of the fixed oscillator, on the one hand, and the second mixing stages, on the other hand, and each being cross-connected via a second input and the first and second level controllers, respectively, to said outputs of the fixed oscillator, these two level controllers being connected to the phase control input of the balancing arrangement via control inputs.

This embodiment is particularly suitable for integration and results in an interference-insensitive phase control.

Another preferred embodiment of a receiver according to the invention provides a possibility to simplify the realization of the amplitude control circuit and is therefore characterized in that the amplitude control circuit comprises a third level controller arranged between one of the outputs of one of the two oscillators and the mixing stage connected thereto, a control input of this controller being connected to the amplitude control input of the balancing arrangement.

In a further preferred embodiment which is characterized in that the amplitude control circuit is of a balanced structure and comprises a fourth level controller, the third and fourth level controllers, being included between the outputs of the fixed oscillator, on the one hand, and the pair of second mixing stages, on the other hand, respectively, and to the amplitude control input of the balancing arrangement via a control signal balancing circuit, this amplitude control circuit is particularly insensitive to interference and suitable for integration.

A still further preferred embodiment is characterized in that each of said level controllers comprises a multiplying circuit, a first input of which is connected to an output of the fixed oscillator, a second input is connected to one of the two control inputs of the balancing arrangement and an output is connected to an output of the relevant level controller.

DESCRIPTION OF THE DRAWINGS

The invention will now be described in greater detail by way of example with reference to the accompanying drawings.

Herein:

FIG. 3 shows a balanced structure of the amplitude and phase control circuit in a receiver according to the inventon;

FIGS. 4A–4G show frequency characteristics of the signal in different places in a receiver according to the invention;

FIG. 4H shows frequency characteristics of the low-frequency filters and the high-pass filter in the receivers shown in FIGS. 1 and 2;

FIGS. 5A–5E show frequency characteristics of a received double-sideband AM signal in different places in a receiver according to the invention; and FIG. 6 shows alternative means for obtaining first and second output signals which are mutually mirror-inverted.

DESCRIPTION OF THE PREFERRED EMBODIMENTS

Figure 1:
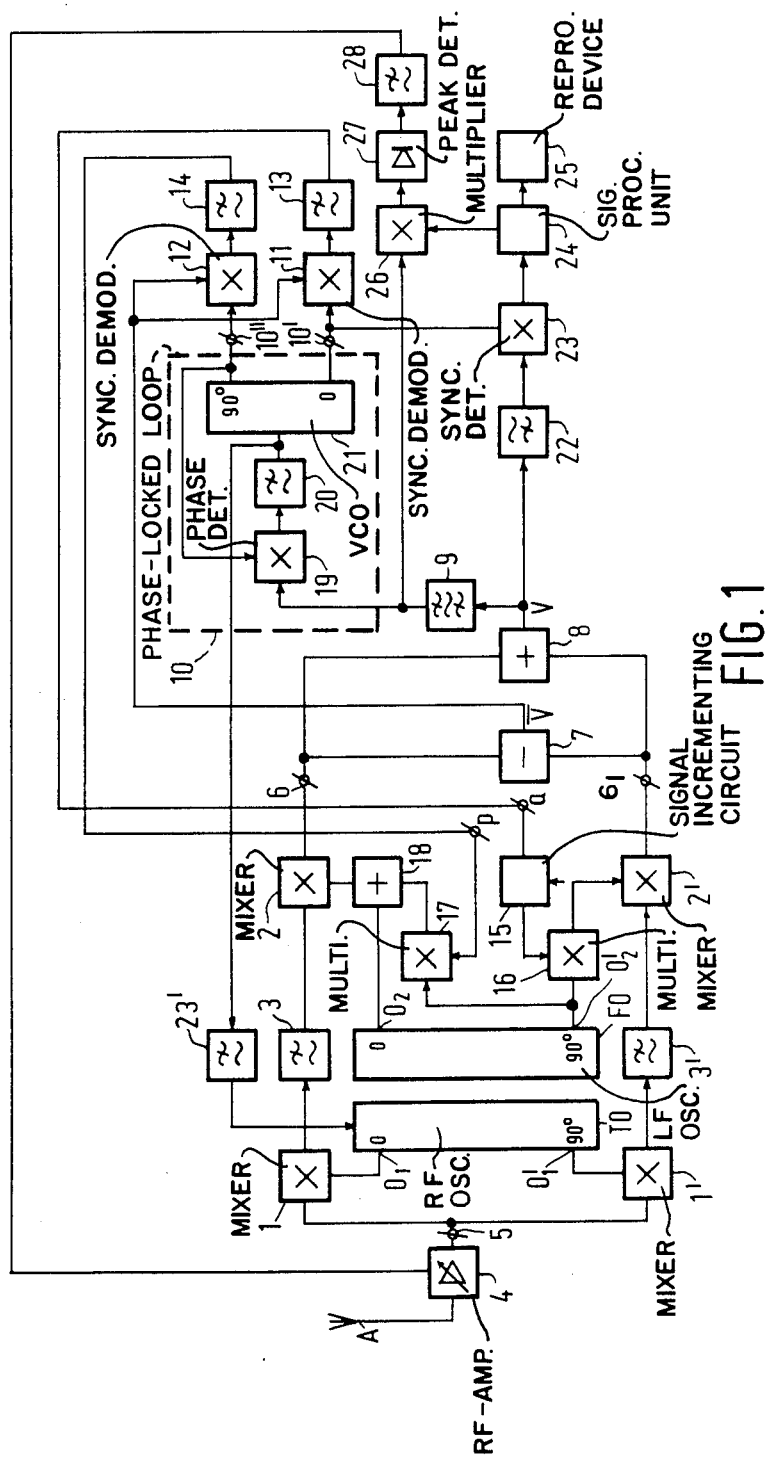
FIG. 1 shows a receiver according to the invention which is suitable for receiving television signals.

FIG. 1 shows a receiver according to the invention which is suitable for receiving television signals and comprises, connected to an aerial A, a controllable RF-amplifier 4, an output 5 thereof forming the RF-input of two parallel signal paths 1-3, 1'-3', which signal paths 1-3, 1'-3' are connected via outputs 6, 6' to an adder stage 8 which functions as a super-position circuit, and a subtracting stage 7 which acts as a further superposition circuit. The two signal paths 1-3, 1'-3' comprise, interconnected in succession, a first pair of mixing stages 1, 1', a pair of low-pass filters 3, 3', functioning as LF-filtering elements, and a pair of second mixing stages 2, 2'. An RF-tuning oscillator TO is connected to mixing signal inputs of the first mixing stages 1, 1' via outputs $0_1$, $0_1'$ and a fixed LF-oscillator FO is coupled to mixing signal inputs of the second mixing stages 2, 2' via outputs $0_2$, $0_2'$ and a controllable balancing arrangement 15–18. In the subtracting stage 7 and the adder stage 8, the signals from the outputs 6, 6' are subtracted from each other and added together, respectively, which results in second and first output signals $\overline{V}$ and V, respectively, at the outputs of the stages 7 and 8.

The output of the adder stage 8 is connected via a bandpass filter 9 which functions as a carrier selection circuit 9, to an input of a phase-locked loop 10 which functions as a carrier regeneration circuit. The phase-locked loop 10 comprises, connected in succession to the carrier selection circuit 9, a phase detector 19, a loop filter 20 and a voltage-controlled oscillator 21 having an in-phase output 10' and a phase quadrature output 10", which are connected to carrier inputs of first and second synchronous demodulators 11 and 12, respectively. Signal inputs of these two synchronous demodulators 11 and 12 are connected to an output of the subtracting stage 7, while outputs thereof are connected, via low-pass filters 13 and 14, respectively, to amplitude and phase control inputs a and p of the controllable balancing arrangement 15–18. The controllable balancing arrangement 15–18 comprises an amplitude control circuit 15–16 and a phase control circuit 17, 18 which, in a manner still further to be described hereinafter, controls in dependence on an amplitude and phase control signal A and P, respectively, at the amplitude and phase control inputs a and p, the amplitude and the phase of at least one of the LF-oscillator mixing signals applied to the two second mixing stages 2, 2'.

When the receiver described so far is used for the reception of TV-signals, tuning to a desired TV receiving signal is effected by adjusting the frequency $f_{TO}$ of the RF-tuning oscillator TO at least substantially the center frequency in the spectrum of the received modulation signal, or the TV-signal as the case may be, that is to say to at least substantially $\frac{1}{2}$ ($f_V+f_S$), $f_V$ being the picture carrier frequency and $f_S$ the sound carrier frequency. All this is schematically shown in FIG. 4A. The frequency spacing between $f_V$ and $f_S$ may then, for example, be 5.5 MHz and the frequency spacing between $f_{TO}$ and $f_V$, for example, 2.25 MHz.

As a result thereof, in the first two mixing stages 1 and 1', the frequency is mixed down, folding of the spectrum of the TV-signal around 0 Hz being simultaneously effected approximately in the region of the center frequency. The folded frequency spectrum of the two low-frequency (LF) TV-signals at the outputs of the two first mixing stages 1, 1' is shown schematically in FIG. 4B. The picture carrier frequency $f_V$ is then 2.25 MHz and the sound carrier frequency $f_S$ is 3.25 MHz. As a result of the mutual phase quadrature relationship between the oscillator signals applied to the first mixing stages 1 and 1', respectively, there is a mutual 90° phase difference between the LF-TV-signals at the outputs of the two first mixing stages 1 and 1'. These LF phase quadrature TV-signals are thereafter applied to the two mixing stages 2 and 2' after selection in the low-pass filters 3 and 3', whose frequency characteristics are illustrated, by way of example, in FIG. 4H by means of curve LP. The selection not only can be used for suppressing a neighboring transmitter, but also to obtain a certain desired attenuation of the sound signal relative to the picture signal. With an adequate dimensioning of these low-pass filters 3 and 3', for example, when they are of the sixth order with a 3 dB bandwidth of the order of magnitude of $2\frac{1}{4}$ MHz, a frequency-dependent signal decay in the higher frequency range of the LF-TV-signals is obtained that simplifies the realization of a Nyquist edge around the picture carrier in a later stage. FIG. 4B illustrates, by means of a dotted line, the variation of such a frequency-dependent signal decay.

In the two second mixing stages 2 and 2', the frequency of the two LF phase quadrature TV-signals is stepped up, converted to a center frequency by means of a frequency $f_{FO}$ of the fixed-LF oscillator FO, which, for a perfect unfolding of the folded LF-TV-signal spectrum, must be higher than the highest signal frequency in this spectrum, for example at 4 MHz as is shown in FIG. 4B. The center frequency then amounts to $f_{FO}-f_V$, $f_V$ being the LF-picture carrier frequency. As, moreover, the oscillator mixing signals applied to the two second mixing stages 2 and 2' are in a phase-quadrature relationship relative to each other, this mixing operation again produces a mutual 90° phase shift between the TV-signals in the two signal paths. Depending on the sign of the mutual phase-quadrature relationship between the oscillator mixing signals applied to the first mixing stages 1 and 1' and to the second mixing stages 2 and 2', respectively, that is to say the phase of one oscillator mixing signal leading or lagging the other mixing signal by 90°, there is produced, in a manner known per se at the output 6 of the signal path 1–3, the difference between two intermediate frequency (IF)TV-signals which are mirror-inverted relative to the frequency $f_{FO}$ and at the output 6' of the signal path 1'–3' the sum thereof, or vice versa.

By adding this sum and this difference together in the adder stage 8, the first output signal V becomes available which comprises predominantly one of the two last-mentioned IF-TV-signals. By subtracting in the subtracting stage 7 said sum and said difference from each other, the second output signal $\overline{V}$ becomes available, which predominantly comprises the other IF-TV-signal. FIG. 4C shows schematically, by way of example, the frequency spectrum of the IF-TV-signal occurring in the first output signal V by means of curve S and FIG. 4D schematically illustrates the IF-TV-signal occurring in the second output signal $\overline{V}$ by means of curve $\overline{S}$. The curves S and $\overline{S}$ are mutually mirror-inverted relative to $f_{FO}$, as are also, of course, the picture carrier frequencies $f_V$ and $\overline{f_V}$, and the sound carrier frequencies $f_S$ and $\overline{f_S}$ contained therein.

Deviations in the amplitude and phase correspondance of the signals in the two signal paths relative to each other may occur in practice, due to inter alia asymmetrical inaccuracies in the element values of the components of the circuits 1, 2 and 3 relative to those of the circuits 1', 2' and 3', aging, temperature differences, an amplitude and/or a phase difference deviating from 90° between the oscillator mixing signals of the oscillators, etc. These deviations result in both the first output signal V and the second output signal $\overline{V}$ including an image interference signal which is equal to the vectorial difference of the TV-signals which do not fully compensate each other in the adding stage 8 and the subtracting stage 7, respectively. In the first output signal V, as well as in the second output signal $\overline{V}$, the location of the frequency spectrum of the imageinterference signal is consequently mirror-inverted therein around $f_{FO}$ relative to the frequency spectrum of the relevant TV-signal S and $\overline{S}$ respectively. By way of example, curve n in FIG. 4C illustrates the frequency spectrum of the image interference signal in the first output signal V and in FIG. 4D, the frequency spectrum of the image interference signal in the second output signal $\overline{V}$ is schematically illustrated by means of curve $\overline{n}$. For the sake of clarity, the curves n and $\overline{n}$ are plotted below the frequency axis: actually, the image interference signals are, of course, superimposed on the respective IF-TV-signal S and $\overline{S}$ and are not separately available.

From the FIGS. 4C and 4D, it will be obvious that due to the mirror-inverted locations of the frequency spectra S and $\overline{S}$ relative to the frequency $f_{FO}$, n and $\overline{n}$, S and n, as well as $\overline{S}$ and $\overline{n}$, the frequency location of the IF-TV-signal S in the output signal V corresponds to that of the image interference signal $\overline{n}$ in the other output signal $\overline{V}$, and that the frequency location of the IF-TV-signal $\overline{S}$ corresponds to that of the image interference signal n in V. Put differently, the image interference component in V, associated with a given signal component, for example a carrier, corresponds, as regards its frequency position, to the relevant signal component itself in $\overline{V}$ and vice versa. The amplitude of this image interference component corresponds with the magnitude of the d.c. voltage product, which is obtained by multiplication or synchronous detection of one of the output signals $\overline{V}$ or V by the relevant signal component from the other output signal V or $\overline{V}$, and the phase thereof in the d.c. voltage product, which is obtained by multiplication or synchronous detection of one of the output signals V or $\overline{V}$ by the relevant 90°-phase shifted signal component in the other signal $\overline{V}$ or V.

Although, in principle, signal components other than the carrier in the spectrum S or $\overline{S}$ may be used as a reference for determining the image interference signal, a carrier is in practice preferably used as a reference, as such a carrier is continuously present and is not affected by the signal content. The amplitude and phase of the image interference component thereof is consequently a reliable measure of the amplitude and the phase of the total image interference signal and, consequently, of the last-mentioned deviations in the amplitude and phase correspondance of the signals in the two signal paths.

It is obvious that a corresponding frequency position between a carrier and its image interference signal component for the above-mentioned synchronous detection in the synchronous demodulators 11 and 12 can alternatively be realized in different manners. Thus, it is, for example, very possible to mirror-invert one of the two output signals V or $\overline{V}$ around $f_{FO}$ in the way shown in FIG. 6 and still to be described hereinafter, to obtain the other output signal $\overline{V}$ or V. Forming the other output signal $\overline{V}$ or V by means of superposition in the subtracting or adding stage, is then not necessary.

In the embodiment shown, the picture carrier $f_V$ is used as a reference to determine the image interference signal and is selected for that purpose by means of the carrier selection circuit 9 from the first output signal V of the adding stage 8. The use of the picture carrier as a reference has, because of its comparatively large amplitude, the advantage that with simple means, an accurate detection of both the amplitude and the phase of the image interference, and of the TV-reception signal amplitude for an AVC-control still to be described hereinafter, is possible. In addition, the picture carrier $f_V$ is suitable for use in a synchronous detection, also to be described hereinafter, of the TV-IF-signal S.

The selected picture carrier $f_V$ is applied as a control signal to the phase-locked loop 10, which generates, in known manner, a detection carrier which is in-phase with this picture carrier and applies this detection carrier to the carrier input of the first synchronous demodulator 11 via the in-phase output 10', and also generates a detection carrier which is shifted through 90° relative to the picture carrier, that is to say a quadrature detection carrier, and applies it to the carrier input of the second synchronous demodulator 12 via the quadrature output 10''. The output signal $\overline{V}$ of the subtracting stage 7 is applied to the signal inputs of the two synchronous demodulators 11 and 12. The d.c. voltage products at the outputs of the synchronous demodulators 11 and 12, respectively, which, as mentioned in the foregoing, indicate the magnitude of the in-phase and the quadrature components of the image interference of the picture carrier $f_V$ are applied, after selection in the low-pass filters 13, 14 as amplitude and phase control signals A and P to the amplitude and phase control circuits 15, 16 and 17, 18, respectively, via the amplitude phase control inputs a and p.

The amplitude control circuit 15, 16 controls the mixing gain of the second mixing stage 2' by amplifying the oscillator mixing signal applied thereto by a factor $(1+A)$. This results in a negative feedback of the amplitude unbalance between the signals in the two signal paths, which amplitude unbalance gave rise to said amplitude control signal A earlier. To that end, the amplitude control circuit 15, 16 comprises a multiplying circuit 16, which functions as a so-called third level controller, a first input of which is connected to the output $O_2'$ of the fixed oscillator FO, a second input, via a signal incrementing circuit 15, to the amplitude control input a and an output to the second mixing stage 2'. The amplitude control signal A applied to the amplitude control input a is incremented in the incrementing circuit 15 by a factor 1 to $(1+A)$, with which thereafter the oscillator mixing signal being applied to the second mixing stage 2', is amplitude-modulated in the multiplying circuit 16.

With the phase control circuit 17, 18, a deviation of the phase-quadrature relationship between the two oscillator mixing signals of the fixed-frequency oscillator FO is realized, which varies such with the magnitude of the phase control signal P that this results in a negative feedback of the phase-unbalance between the signals in the two signal paths, which effected the phase control signal P earlier. To that end, in the first adding circuit 18, of the phase control circuit 17, 18 a vectorial addition is effected of these two oscillator mixing signals, said first adding circuit 18 being connected to the two outputs $O_2$ and $O_2'$ of the fixed oscillator FO, on the one hand, and to the second mixing stage 2, on the other hand, the amplitude of the oscillator mixing signal from the output $O_2'$ varying linearly with P by means of a multiplying circuit 17 arranged between this output $O_2'$ and the first adding circuit 18 and functioning as a so-called first level controller. The multiplying circuit 17 multiplies the oscillator mixing signal, which is applied to a first input, by the phase control signal P, which is applied to a second input.

It will be obvious that an amplitude and phase balancing of the signals in the two signal paths can alternatively be realized in a way different from the way described in the foregoing. It is, for example, possible to arrange, instead of the amplitude control circuit 15, 16, a variable-gain amplifier and/or instead of the phase control circuit 17, 18, a controllable phase shifter, in one of the two signal paths or between the outputs $O_1$ and $O_1'$ of the RF-tuning oscillator TO and the first mixing stages 1 and 1'.

It is alternatively conceivable to omit the carrier regeneration and to use the relevant carrier itself, which was selected in the carrier selection circuit 9, optionally after having been amplified, as an in-phase detection carrier and, after a 90° phase shift in, for example, a passive phase-shifting network, as a quadrature detection carrier. In the embodiment shown, however, the phase-locked loop 10 is not only used for a simple regeneration of a detection carrier which is in-phase and in quadrature with the picture carrier, but also for generating an AFC control signal. This control signal is derived from the output signal of the loop filter 20 of the phase-locked loop 10, which, as is known, represents the instantaneous frequency deviation of the control signal, in the present case the picture carrier. As a result thereof, this loop filter output signal is eminently suitable to realize an AFC. For that purpose, an output of the loop filter 20 is connected to a control input of the RF-tuning oscillator TO via a low-pass filter 23' in which adequate integration of the output signal of the loop filter 20 is effected.

The amplitude of the picture carrier at the output of the carrier selection circuit 9 is a reliable measure of the amplitude of the received TV-signal and is measured, independent of the signal content, by sampling this picture carrier at instants at which a reference level occurs in the video signal, for example during the line synchronizing pulses. This sampling operation is effected with the aid of a multiplying circuit 26, which is connected to the carrier selection circuit 9 and functions as a gate circuit, and to which the line synchronizing signal of the received TV-signal is applied, as a gate signal, optionally after having been subjected to a delay. The sampled picture carrier at the output of the multiplying circuit 26 is thereafter amplitude-detected via a peak detector 27 and an integrator 28 and integrated into an AGC signal which is applied to the control input of the variable-gain RF amplifier 4 for an AGC to be effected.

The television receiver of FIG. 1 also shows, connected in succession to the output of the adding stage 8 a high-pass filter 22, a synchronous video detector 23, a signal processing unit 24 and a reproduction device 25. The high-pass filter 22, which has a frequency characteristic as shown in FIG. 4H by means of the dotted curve HP, is preferably of the second order and has a 3 dB cross-over frequency of at least substantially 1.5 MHz, effects, ultimately, a Nyquist edge in the IF-TV-signal S, as shown in an idealized way in FIG. 4E. A synchronous detection of the last-mentioned IF-TV-signal S is effected in the synchronous video detector 23 and, simultaneously, an intercarrier detection of the TV-sound signal at $f_S$ by multiplying these signals by the regenerated in-phase picture carrier. A carrier input of the synchronous video detector 23 is connected for that purpose to the in-phase output 10' of the phase-locked loop 10. The baseband video signal thus obtained and the IF-sound signal as shown schematically in FIG. 4F are further processed in the processing circuit 24 in a manner known per se into base-band picture and sound signals and reproduced in the reproduction device 25. The signal processing circuit 24 comprises inter alia a line sync. separator, not shown, which is connected to the above-described multiplying circuit 26 for applying thereto the line synchronizing signal as a gate signal.

Figure 2:
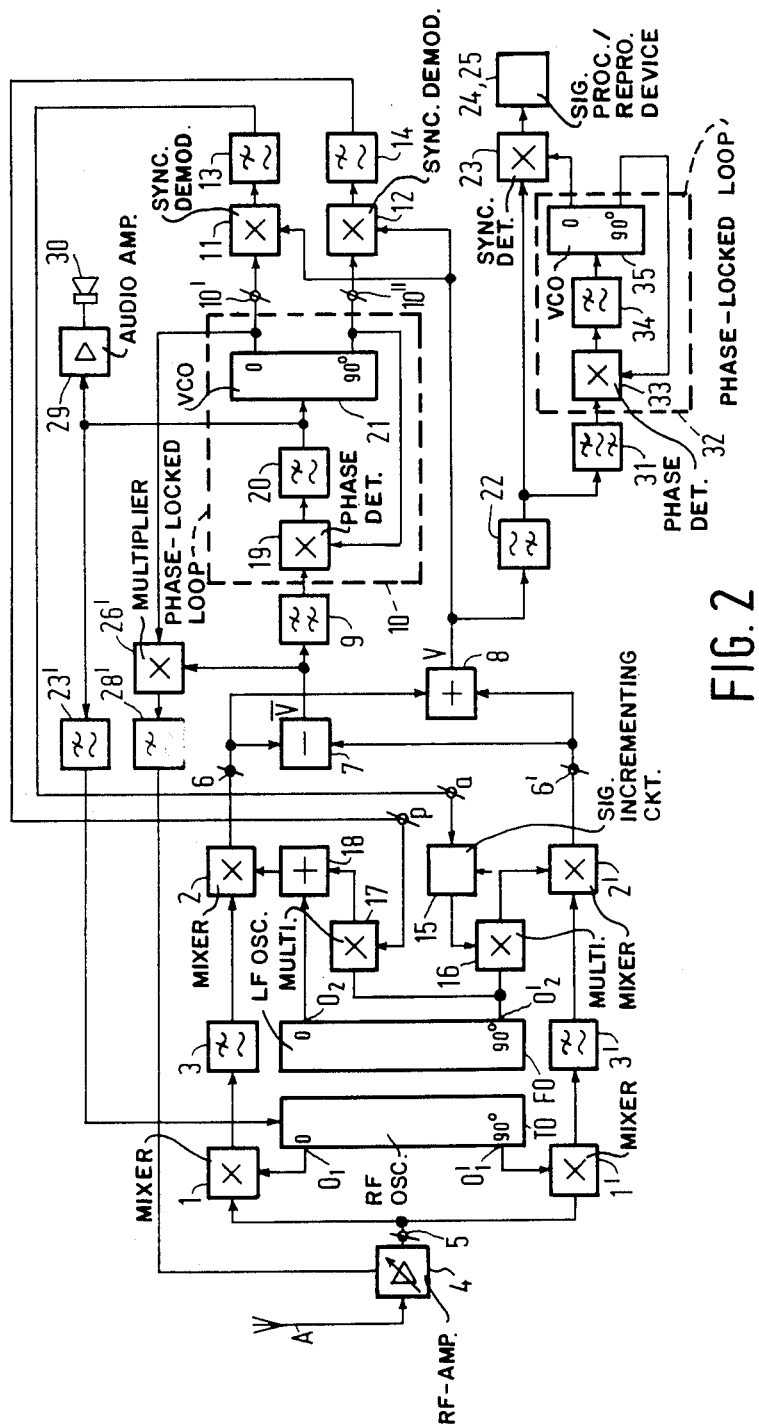
FIG. 2 shows a receiver according to the invention which is suitable for receiving television signals having a frequency-modulated sound carrier.

FIG. 2 shows a receiver which is suitable for receiving television signals comprising a frequency-modulated sound carrier. The circuits present therein which have the same functions as the circuits of the receiver shown in FIG. 1 are given the same reference numerals.

Contrary to what occurs in the receiver shown in FIG. 1, in the receiver shown in FIG. 2, the sound carrier $f_S$ in the second output signal $\bar{V}$ is used as a reference in the determination of the amplitude and phase of the image interference n in the first output signal V. To that end, in the present receiver the output of the subtracting stage 7 is connected to the carrier selection circuit 9, the output of the adder stage 8 to the signal inputs of the two synchronous demodulators 11 and 12. The carrier selection circuit 9 is tuned to the center frequency of the FM sound carrier $f_S$ in the second output signal $\bar{V}$. The bandwidth of the carrier detection circuit 9 has been chosen such that, on the one hand, the frequency modulation of the sound carrier $f_S$ is also allowed to pass, and, on the other hand, an effective suppression of the picture signal components of the TV-IF-signal $\bar{S}$, as shown in an idealized way in FIG. 4G, is obtained. The phase-locked loop 10 is now not only used for generating a detection carrier which is in-phase and in quadrature with the carrier of the received signal, in the present case the sound carrier, and for generating an AFC-control voltage, but, at the same time, provides a frequency detection of the relevant frequency-modulated sound carrier $f_S$. As a result of the above-mentioned suppression of the picture signal components in the picture carrier selection circuit 9, no, or at least hardly any noticeable, disturbance of the modulated sound signal by the picture signal occurs with this so-called "split sound" signal processing.

The demodulated sound signal becomes available at the output of the loop filter 20 and is, on the one hand, reproduced after having been amplified in the audio amplifier 29 by means of a loudspeaker 30 connected thereto, and, on the other hand, is applied, after suitable integration in the integrator 23', as an AFC-control signal to the RF-tuning oscillator TO. As the amplitude of the frequency-modulated sound carrier $f_S$ is in a fixed relationship to the amplitude of the TV-receiving signal, an AGC control signal can be obtained therefrom in a simple way by means of amplitude detection of the sound carrier $f_S$. To that end a synchronous detection of this FM sound carrier $f_S$ is effected in a multiplier 26', a carrier input of which is connected to the in-phase output 10' of the phase-locked loop 10 and a signal input to an output of the subtracting stage 7, optionally, not shown, via the carrier selection circuit 9. The d.c. voltage product at the output of the multiplying circuit 26' is applied, after suitable integration in an integrator 28', as an AGC control signal for AGC to the variable-gain RF-amplifier 4.

The present TV-receiver comprises for processing the video signal a picture carrier filter 31 arranged between the high-pass filter 22 and the picture carrier input of the synchronous video detector 23 and a phase-locked loop 32, which functions as a picture carrier regenerator and in which, in known manner, a regeneration of the IF-picture carrier $f_V$ selected from the TV-IF-signal by the picture carrier filter 31, is effected. In the synchronous video detector 23, synchronous detection of the video signal is effected with this regenerated picture carrier and the baseband video signal thus obtained is further processed in the unit 24, 25 and displayed.

It will be evident that it is alternatively possible to use the sound carrier $f_S$ of the first output signal V of the adding stage 8 as a reference to determine the amplitude and phase of the image interference $\bar{n}$ in $\bar{V}$. It should further be noted that the output signal V can be obtained by means of the subtracting stage 7 and the output signal $\bar{V}$ by means of the adder stage 8 by inverting the mutual phase quadrature relationship between the oscillator mixing signals of one of the two oscillators, the leading or lagging of one oscillator mixing signal relative to the other oscillator mixing signal being changed into lagging or leading, respectively.

FIG. 3 shows a balanced embodiment of the balancing arrangement 15-18 comprising, as a phase control circuit in addition to the first adding circuit 18, and the multiplying circuit 17 operating as first level controller already mentioned, a second adding circuit 18' and a multiplying circuit 17' which operates as a second level controller. The two adding circuits 18 and 18' are each connected via a first input and an output between the outputs $0_2$ and $0_2'$ of the fixed oscillator FO, on the one hand, and the second mixing stages 2 and 2', on the other hand, and are each connected cross-wise via a second input and the first and second level controller 17 and 17', respectively, to the outputs $0_2$ and $0_2'$, the phase control signal p/2 being applied to these level controllers 17 and 17' from the phase control input p. Controlling the phase relationship between the oscillator mixing signals of the fixed oscillator FO and, consequently, of the signals in the two signal paths, is thus realized by an in-phase control of both oscillator mixing signals such that their phase difference becomes smaller or larger due to an equal phase variation of each of both oscillator mixing signals, which depends on n/2.

The balanced balancing arrangement 15-18 has, as an amplitude control circuit in addition to the abovementioned first signal-incrementing circuit 15 and the multiplying circuit 16 which operates as a third level controller, a signal-incrementing circuit 15' and a multiplying circuit 16' which operates as a fourth level controller. The third and fourth level controllers 16 and 16' are then arranged between, on the one hand, the first and the second adding circuits 18 and 18' and, on the other hand, the two second mixing stages 2 and 2', respectively. Amplitude control signals $1+\frac{1}{2}A$ and $1-\frac{1}{2}A$, respectively, are applied to these third and fourth level controllers 16 and 16' via the signal-incrementing circuits 15 and 15', for which purpose the signal-incrementing circuits 15 and 15' are connected to the amplitude control input a via a balanced attenuation circuit 36. This attenuation control circuit 36 applies the amplitude control signal $\frac{1}{2}A$ with mutually inverted polarity to the two signal-incrementing circuits 15 and 15'. The control of the amplitude relationship between the two oscillator mixing signals and, consequently, between the signals in the two signal paths relative to each other, is thus realized by reducing the amplitude of one oscillator mixing signal and by simultaneously increasing the amplitude of the other oscillator mixing signal to an equal extent.

FIGS. 5A-5E show schematically, by way of example, some frequency spectra in a receiver on reception of a double-sideband AM-modulated (radio) signal.

FIG. 5A shows the frequency spectrum of the RF-receiving signal as well as an RF-tuning frequency $f_{TO}$ which deviates from the RF-carrier $f_c$.

FIG. 5B shows the folded frequency spectrum of the LF-phase quadrature signals at the output of the first mixing stages 1 and 1'. After selection in the two low-pass filters 3 and 3', an upward frequency conversion of the two LF-phase quadrature signals is effected in the second mixing stages 2, 2' by means of a frequency $f_{FO}$ from the fixed oscillator FO which exceeds the highest signal frequency in the LF-phase-quadrature signal, for example, 20 kHz. Simultaneously, the phase-quadrature relationship is changed in the above-described way in such an in-phase and anti-phase relationship that in one of the two stages 7 or 8, a first output signal having the spectrum V, as illustrated in FIG. 5C, and in the other stage, a second output signal having the spectrum $\bar{V}$, as illustrated in FIG. 5D, are obtained. The carrier in each of the signals is perfectly suitable for use as a reference in the determination of the image interference, as the carrier $f_c$ is located at the same frequency as its image interference component $f_n$ in $\bar{V}$, and the carrier $f_c$ in $\bar{V}$ is located at the same frequency as its image interference component $f_n$ in V.

By adjusting the carrier selection circuit to the carrier of one of the output signals V and $\bar{V}$, and applying the other output signal to the signal inputs of the synchronous demodulators 11 and 12, an amplitude and phase balance between the two signal paths 1-3 and 1'-3' can be obtained in the same way as for the receivers shown in FIGS. 1 and 2.

An AFC can then be realized in the same way as in the two preceding receivers and an AGC can be obtained in the way shown for the receiver of FIG. 2.

The further signal processing operation can also be effected in the manner as shown for the two preceding receivers by means of a synchronous detection of one of the signals S and $\bar{S}$ of the FIGS. 5C and 5D. This provides the baseband modulation signal, whose frequency spectrum is shown in an idealized manner in FIG. 5E.

It will be obvious that on reception of an RF-AM single-sideband signal, not shown, the modulation signal can be obtained by a suitable choice of $f_{TO}$ and $f_{FO}$ in the baseband at the output of the superposition circuit. It is then, for example, possible to use the same measure when a pilot is present in this baseband modulation signal, by adjusting the carrier selection circuit to this pilot.

FIG. 6 shows alternative means for obtaining the second output signal $\bar{V}$ from the first output signal V, by means of frequency mirror-inversion in a receiver, which, for the sake of clarity, is shown in part only and in which the circuits whose function corresponds to the function of the circuits of the receivers shown in FIGS. 1 and 2 are given the same reference numerals.

These means comprise a multiplying circuit 38, a first input of which is connected to an output of the adding stage 8 and a second input is connected to one of the outputs $O_2$ or $O_2'$ of the fixed oscillator FO via a frequency doubler 37. In the majority of practical embodiments of the fixed oscillator FO, the phase-quadrature oscillator signals are derived from an internal clock frequency which amounts to twice the frequency of the phase-quadrature oscillator signals, and the frequency doubler 37 may then be omitted. Multiplying the first output signal V of the adding stage 8 by 2 $f_{FO}$ results, on the one hand, in a lower-sideband product which is the mirror-inverted version of the first output signal V around $f_{FO}$, and which consequently produces the second output signal $\overline{V}$, and an upper-sideband product, which corresponds to the first output signal V shifted by 2 $f_{FO}$. By selecting a carrier from this lower-sideband product, i.e. the second output signal $\overline{V}$ by means of the carrier selection circuit 9, the object of the invention can be accomplished in the above-described manner.

It will be evident that it is alternatively possible to obtain the second output signal $\overline{V}$ by a corresponding frequency image-inversion of the first output signal V.

It should further be noted that in the receiver shown each of the first and the second output signals V and $\overline{V}$, respectively, is suitable for signal processing, as each of the output signals comprises the complete signal information. It will be obvious that when the signal information in situ of 0 Hz in the LF-signal spectrum can be missed without causing any inconvenience, it is possible to use bandpass filters instead of lowpass filters for the filter elements 3 and 3'.

What is claimed is:

1. A receiver for receiving a signal modulated on an RF-carrier, said receiver comprising a pair of signal paths arranged in parallel between an RF-input and superposition circuit means and including, arranged in succession, a pair of first mixing stages for mixing down a frequency of the received modulated RF-carrier to a low frequency, mixing signals being applied in a phase quadrature relationship to these first mixing stages from an RF-tuning oscillator, a pair of filtering elements at the output of the first mixing stages for modulated carrier signal selection and a pair of second mixing stages for up-converting the frequency of the selected modulated carrier, mixing signals being applied, also in a phase quadrature relationship, to these second mixing stages from a fixed LF-oscillator, these second mixing stages being connected to inputs of the superposition circuit means, the superposition circuit means being arranged between outputs of the two signal paths and producing a first and a second output signal, wherein said second output signal, relative to the first output signal, is mirror-inverted around the frequency of the fixed LF-oscillator, and one of said first and second output signals being applied to a carrier selection circuit, one side of which is connected to a carrier input of a first synchronous demodulator and to a carrier input on a second synchronous demodulator via 90°-phase shifting means, and the other of said first and second output signals is applied to signal inputs of the first and second synchronous demodulators, the first and second synchronous demodulators being connected to an amplitude control input and to a phase control input, respectively, of a controllable balancing arrangement via respective low-pass filters, this controllable balancing arrangement comprising an amplitude control circuit and a phase control circuit for mutually balancing the amplitudes and phases of the signals in the two signal paths.

2. A receiver as claimed in claim 1, characterized in that said superposition circuit means comprises an adding stage for producing said first output signal, and a subtracting stage for producing said second output signal.

3. A receiver as claimed in claim 1, characterized in that the said superposition circuit means comprises a multiplying circuit for producing said second output signal, a first input thereof being connected to the two signal paths via the superposition circuit means and a second input thereof being coupled to an output of the fixed LF-oscillator, to which second input an oscillator frequency is applied which is twice the oscillator frequency applied to the two second mixing stages.

4. A receiver as claimed in claim 1, 2 or 3 for receiving television signals, characterized in that the frequency of the RF-tuning oscillator, when being correctly tuned to a broadcast transmission, is located between a picture and a sound carrier of the desired television signal, that the frequency of the mixing signals applied to the second mixing stages from the fixed LF-oscillator is at least equal to a highest signal frequency in the signal at the output of said pair of filtering elements, and that the carrier selection circuit is adjusted to the carrier in said one of said first and second output signals applied to the carrier selection circuit.

5. A receiver for receiving television signals as claimed in claim 4, characterized in that the carrier selection circuit is adjusted to one of said picture carrier in the first and second output signals applied to the carrier selection circuit, this carrier selection circuit being connected for automatic gain control via a gate circuit and a pink detector to a variable amplifier device connected to the two signal paths, this gate circuit being controlled by means of a gate signal derived from a line synchronizing signal of the received TV-signal.

6. A receiver for receiving television signals as claimed in claim 4, characterized in that the carrier selection circuit is adjusted to the picture carrier in one of the first and second output signals applied to the carrier selection circuit, said one output signal is also applied to a synchronous video detector included in a processing arrangement via a high-pass filter, this carrier selection circuit also being connected to a carrier input of the synchronous video detector.

7. A receiver for receiving television signals having a frequency-modulated sound carrier as claimed in claim 4, characterized in that the carrier selection circuit is adjusted to a center frequency of a frequency-modulated sound carrier in one of the first and second output signals applied to the carrier selection circuit, which output signal is also applied to a first input of a multiplying circuit, that an output of the carrier selection circuit is connected to a second input of the multiplying circuit and an output of the multiplying circuit is connected, via an integrator for an automatic gain control, to a variable amplifier connected to one of the two signal paths.

8. A receiver for receiving television signals having a frequency-modulated sound carrier as claimed in claim 4, characterized in that the carrier selection circuit is adjusted to a center frequency of the sound carrier in one of the first and second output signals applied to the carrier selection circuit, and is connected to the first and second synchronous demodulators via a phase-controlled loop, said phase-controlled loop comprising a phase detector connected to the carrier selection circuit, a loop filter and a voltage-controlled oscillator having an in-phase and a quadrature output, the in-phase output being connected to the carrier input of the first synchronous demodulator and the quadrature output being connected to the phase detector and also to the carrier input of the second synchronous demodulator, an output of the loop filter being connected to an audio signal processing unit and one of the first and second output signals being applied via a high-pass filter to a signal input of a synchronous video detector and to a picture carrier regenerator, this picture carrier regenerator being connected to a carrier input of the synchronous video detector.

9. A receiver as claimed in claim 4, characterized in that the carrier selection circuit is connected to the first and second synchronous demodulators via a phase-locked loop, this phase-locked loop comprising a phase detector connected to the carrier selection circuit, and also a loop filter and a voltage-controlled oscillator having an in-phase and a quadrature output, the in-phase output being connected to the carrier input of the first synchronous demodulator and the quadrature output being connected to the phase detector and also to the carrier input of the second synchronous demodulator, and that an output of the loop filter is connected to a control input of the RF-tuning oscillator via an integrator for an automatic frequency control.

10. A receiver for receiving television signals as claimed in claim 6, characterized in that the pair of filtering elements are sixth-order low-pass filters having a 3 dB cross-over frequency of the order of 2.25 MHz, and the high-pass filter is of the second order having a 3 dB cross-over frequency of at least substantially 1.5 MHz.

11. A receiver as claimed in claim 9, characterized in that the phase-control circuit comprises a first adding circuit arranged between the outputs of one of the two oscillators and one of the two mixing stages to which mixing signals are applied by said one oscillator and also, arranged between one of said outputs and the adding circuit, a first level controller, a control input of which is connected to the phase control input of the balancing arrangement.

12. A receiver as claimed in claim 11, characterized in that the phase control circuit is of a balanced structure and comprises a second adding circuit, the first and second adding circuits each being connected via a first input and an output between the respective outputs of the fixed LF-oscillator and the second mixing stages, and each being cross-connected via a second input and the first and second level controllers, respectively, to the outputs of the fixed LF-oscillator, the first and second level controllers being connected to the phase control input of the balancing arrangement via control inputs.

13. A receiver as claimed in claim 12, characterized in that the amplitude control circuit comprises a third level controller connected between one of the outputs of one of the two oscillators and the mixing stage connected thereto, a control input of one of the controllers being connected to the amplitude control input of the balancing arrangement.

14. A receiver as claimed in claim 13, characterized in that the amplitude control circuit is of a balanced structure and comprises a fourth level controller, the third and fourth level controllers, respectively, being included between the output of the fixed LF-oscillator and the pair of second mixing stages, respectively, and to the amplitude control input of the balancing arrangement via a control signal balancing circuit.

15. A receiver as claimed in claim 14, characterized in that each of said level controllers comprises a multiplying circuit, a first input of which is connected to an output of the fixed LF-oscillator, a second input of which is connected to one of the two control inputs of the balancing arrangement, and an output of which is connected to an output of the relevant level controller.

16. A receiver for receiving television signals as claimed in claim 5, characterized in that said one of said first and second output signals is also applied to a synchronous video detector included in the processing arrangement via a high-pass filter, the carrier selection circuit also being connected to a carrier input of the synchronous video detector.

17. A receiver for receiving television signals having a frequency-modulated sound carrier as claimed in claim 7, characterized in that the carrier selection circuit is adjusted to the center frequency of the sound carrier in one of the first and second output signals applied to the carrier selection circuit, and is connected to the first and second synchronous demodulators via a phase-controlled loop, said phase controlled loop comprising a phase detector connected to the carrier selection circuit, a loop filter and a voltage-controlled oscillator having an in-phase and a quadrature output, the in-phase output being connected to the carrier input of the first synchronous demodulator and the quadrature output being connected to the phase detector and also to the carrier input of the second synchronous demodulator, an output of the loop filter being connected to an audio signal processing unit and one of the first and second output signals being applied via a high-pass filter to a signal input of a synchronous video detector and to a picture carrier regenerator, this picture carrier regenerator being connected to a carrier input of the synchronous video detector.

18. A receiver as claimed in claim 1, characterized in that the carrier selection circuit is connected to the first and second synchronous demodulators via a phase-locked loop, this phase-locked loop comprising a phase detector connected to the carrier selection circuit, and also a loop filter and a voltage-controlled oscillator having an in-phase and a quadrature output, the in-phase output being connected to the carrier input of the first synchronous demodulator and the quadrature output being connected to the phase detector and also to the carrier input of the second synchronous demodulator, and that an output of the loop filter is connected to a control input of the RF-tuning oscillator via an integrator for an automatic frequency control.

19. A receiver for receiving television signals as claimed in claim 8, characterized in that the pair of filtering elements are sixth-order low-pass filters having a 3 dB cross-over frequency of the order of 2.25 MHz, and the high-pass filter is of the second order having a 3 dB cross-over frequency of at least substantially 1.5 MHz.

20. A receiver for receiving television signals as claimed in claim 16, characterized in that the pair of filtering elements are sixth-order low-pass filters having a 3 dB cross-over frequency of the order of 2.25 MHz, and the high-pass filter is of the second order having a 3 dB cross-over frequency of at least substantially 1.5 MHz.

21. A receiver for receiving television signals as claimed in claim 17, characterized in that the pair of filtering elements are sixth-order low-pass filters having a 3 dB cross-over frequency of the order of 2.25 MHz, and the high-pass filter is of the second order having a 3 dB cross-over frequency of at least substantially 1.5 MHz.

22. A receiver as claimed in claim 1, characterized in that the phase-control circuit comprises a first adding circuit arranged between the outputs of one of the two oscillators and one of the two mixing stages to which mixing signals are applied by said one oscillator and also, arranged between one of said outputs and the adding circuit, a first level controller, a control input of which is connected to the phase control input of the balancing arrangement.

23. A receiver as claimed in claim 10, characterized in that the phase-control circuit comprises a first adding circuit arranged between the outputs of one of the two oscillators and one of the two mixing stages to which mixing signals are applied by said one oscillator and also, arranged between one of said outputs and the adding circuit, a first level controller, a control input of which is connected to the phase control input of the balancing arrangement.

24. A receiver as claimed in claim 22, characterized in that the phase control circuit is of a balanced structure and comprises a second adding circuit, the first and second adding circuits each being connected via a first input and an output between the respective outputs of the fixed LF-oscillator and the second mixing stages, and each being cross-connected via a second input and the first and second level controllers, respectively, to the outputs of the fixed LF-oscillator, the first and second level controllers being connected to the phase control input of the balancing arrangement via control inputs.

25. A receiver as claimed in claim 23, characterized in that the phase control circuit is of a balanced structure and comprises a second adding circuit, the first and second adding circuits each being connected via a first input and an output between the respective outputs of the fixed LF-oscillator and the second mixing stages, and each being cross-connected via a second input and the first and second level controllers, respectively, to the outputs of the fixed LF-oscillator, the first and second level controllers being connected to the phase control input of the balancing arrangement via control inputs.

26. A receiver as claimed in claim 1, characterized in that the amplitude control circuit comprises a third level controller connected between one of the outputs of one of the two oscillators and the mixing stage connected thereto, a control input of one of the controllers connected to the amplitude control input of the balancing arrangement.

27. A receiver as claimed in claim 24, characterized in that the amplitude control circuit comprises a third level controller connected between one of the outputs of one of the two oscillators and the mixing stage connected thereto, a control input of one of the controllers connected to the amplitude control input of the balancing arrangement.

28. A receiver as claimd in claim 25, characterized in that the amplitude control circuit comprises a third level controller connected between one of the outputs of one of the two oscillators and the mixing stage connected thereto, a control input of one of the controllers being connected to the amplitude control input of the balancing arrangement.

29. A receiver as claimed in claim 26, characterized in that the amplitude control circuit is of a balanced structure and comprises a fourth level controller, the third and fourth level controllers, respectively, being included between the output of the fixed LF-oscillator and the pair of second mixing stages, respectively, and to the amplitude control input of the balancing arrangement via a control signal balancing circuit.

30. A receiver as claimed in claim 27, characterized in that the amplitude control circuit is of a balanced structure and comprises a fourth level controller, the third and fourth level controllers, respectively, being included between the output of the fixed LF-oscillator and the pair of second mixing stages, respectively, and to the amplitude control input of the balancing arrangement via a control signal balancing circuit.

31. A receiver as claimed in claim 28, characterized in that the amplitude control circuit is of a balanced structure and comprises a fourth level controller, the third and fourth level controllers, respectively, being included between the output of the fixed LF-oscillator and the pair of second mixing stages, respectively and to the amplitude control input of the balancing arrangement via a control signal balancing circuit.

32. A receiver as claimed in claim 30, characterized in that each of said level controllers comprises a multiplying circuit, a first input of which is connected to an output of the fixed LF-oscillator, a second input of which is connected to one of the two control inputs of the balancing arrangement, and an output of which is connected to an output of the relevant level controller.

33. A receiver as claimed in claim 31, characterized in that each of said level controllers comprises a multiplying circuit, a first input of which is connected to an output of the fixed LF oscillator, a second input of which is connected to one of the two control inputs of the balancing arrangement, and an output of which is connected to an output of the relevant level controller.

* * * * *

UNITED STATES PATENT AND TRADEMARK OFFICE
CERTIFICATE OF CORRECTION

PATENT NO. : 4,633,315

DATED : December 30, 1986

INVENTOR(S) : Wolfdietrich G. Kasperkovitz

It is certified that error appears in the above-identified patent and that said Letters Patent is hereby corrected as shown below:

IN THE CLAIMS

Claim 5, line 21, delete "pink" insert --peak--

Claim 7, line 7, delete "which" insert --said one--

Signed and Sealed this

Twenty-fourth Day of January, 1989

*Attest:*

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,633,315
DATED : December 30, 1986
INVENTOR(S) : WOLFDIETRICH G. KASPERKOVITZ It is certified that error appears in the above-identified patent and that said Letters Patent is hereby corrected as shown below:

Claim 5, line 3    after "to" insert --the picture carrier in--

Claim 5, line 3    delete "picture carrier"

Claim 5, line 4    delete "in that"

Claim 7, line 7    delete "which" insert --said one--

Claim 7, line 8    delete "that"

Signed and Sealed this

Twenty-fifth Day of July, 1989

*Attest:*

DONALD J. QUIGG

*Attesting Officer*     *Commissioner of Patents and Trademarks*